(12) United States Patent
Do et al.

(10) Patent No.: US 11,404,364 B2
(45) Date of Patent: Aug. 2, 2022

(54) MULTI-LAYER EMBEDDED MAGNETIC INDUCTOR COIL

(71) Applicant: INTEL CORPORATION, Santa Clara, CA (US)

(72) Inventors: Huong Do, Chandler, AZ (US); Kaladhar Radhakrishnan, Chandler, AZ (US); Krishna Bharath, Chandler, AZ (US); Yikang Deng, Chandler, AZ (US); Amruthavalli P. Alur, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 824 days.

(21) Appl. No.: 16/108,953

(22) Filed: Aug. 22, 2018

(65) Prior Publication Data
US 2020/0066627 A1 Feb. 27, 2020

(51) Int. Cl.
| | |
|---|---|
| *H01L 23/498* | (2006.01) |
| *H01L 21/48* | (2006.01) |
| *H01F 17/00* | (2006.01) |
| *H01L 23/522* | (2006.01) |
| *H01L 23/58* | (2006.01) |
| *H01L 49/02* | (2006.01) |
| *H01L 23/64* | (2006.01) |
| *H01F 17/04* | (2006.01) |
| *H01L 23/50* | (2006.01) |

(52) U.S. Cl.
CPC ... *H01L 23/49838* (2013.01); *H01F 17/0033* (2013.01); *H01L 21/4857* (2013.01); *H01L 23/49822* (2013.01); *H01L 23/5226* (2013.01); *H01L 23/5227* (2013.01); *H01L 23/585* (2013.01); *H01L 23/645* (2013.01); *H01L 28/10* (2013.01); *H01F 17/045* (2013.01); *H01L 23/50* (2013.01)

(58) Field of Classification Search
CPC ......... H01L 23/49838; H01L 23/49822; H01L 21/4857; H01L 23/585; H01L 23/645; H01L 28/10; H01L 23/5227; H01F 17/0033
USPC ....................................................... 257/773
See application file for complete search history.

(56) References Cited

U.S. PATENT DOCUMENTS

2014/0246753 A1* 9/2014 Song et al. ......... H01L 23/5227
257/531

* cited by examiner

*Primary Examiner* — Thinh T Nguyen
(74) *Attorney, Agent, or Firm* — Essential Patents Group, LLP.

(57) ABSTRACT

A microelectronics package comprises a substrate that comprises a dielectric and at least two conductor layers within the dielectric, and an inductor structure having a magnetic core at least partially within the dielectric and extending at least between a first conductor layer and a second conductor layer. The inductor structure comprises at least one conductor that extends horizontally at least partially within the magnetic core. The conductor extends in the z-direction within the magnetic core between the first conductor layer and the second conductor layer. One or more vias extend within the dielectric adjacent to the magnetic core between the first conductor layer and the second conductor layer. The conductor of the inductor has a length extending through the magnetic core that is greater than a width of the conductor.

12 Claims, 12 Drawing Sheets

MULTI-LAYER EMBEDDED MAGNETIC INDUCTOR COIL

BACKGROUND

Integrated voltage regulator (IVR) technology is an efficient die and package architecture for managing disparate voltages required by the various functions encompassed by a microprocessor. Currently, IVR implementations in microprocessor packages, such as fully-integrated voltage regulator (FIVR) topologies, rely on air-core inductors. Typically, the air-core inductors are off-die, either on, or embedded within, the package dielectric adjacent to the microprocessor die. Industry advances are reducing package footprint with succeeding microprocessor generations. Z-height constraints imposed by thin package architectures reduce vertical space for the embedded inductor. Copper trace thicknesses are generally limited to 25 microns or less. Consequently, the dc (direct current) resistance of the copper traces in embedded inductors increases from generation to generation, resulting in a declining quality factor (ratio of energy stored in the inductor's magnetic field to energy dissipated by resistive losses in the inductor windings). The overall efficiency of IVRs suffer as losses increase.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1A:
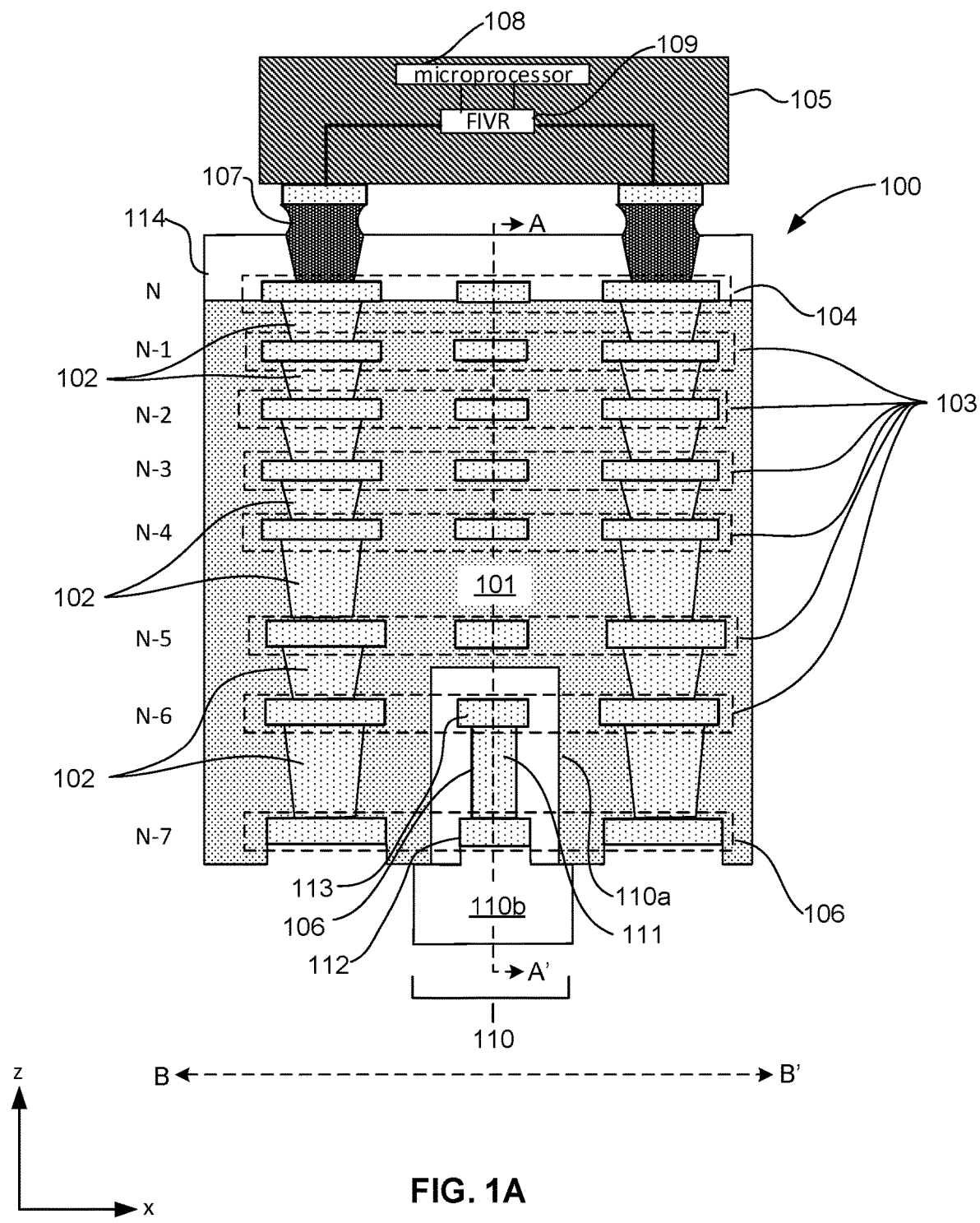
FIG. 1A illustrates a cross-sectional view in the x-z plane of an IC package substrate showing trench inductor, according to embodiments of the disclosure.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Integrated voltage regulators (IVRs), such as fully-integrated voltage regulators (FIVRs) comprise voltage regulation circuitry that is integrated on a microprocessor die. On-die voltage regulation provides several advantages over previous generation off-die schemes such as motherboard-based voltage regulator modules. In general, response to rapidly changing power states and loads is greatly improved by point-of-load regulation as the reactive latency is reduced by a factor of up to 1000. The improvement is beneficial to the overall microprocessor performance, both for core and peripheral functions. As an example, current FIVR power management provides for core and graphics maximum voltage transition times of hundreds of nanoseconds, whereas transition times are characteristically hundreds of microseconds for prior generation voltage regulator modules. As a result, processing speed may be doubled as a result of FIVR power management. Additionally, battery life may be extended by more than 50%.

At least one FIVR may be coupled to each power rail of a microprocessor. Some FIVR topology based on multiphase buck converters that employ air-core inductors can be directly integrated into the microprocessor package substrate. As packages shrink in both footprint and thickness, inductors are impacted by reduced dimensions. Constraints on package thickness require thinner conductors, for example with z-heights under 25 microns. Reducing the z-height of the conductor traces that comprise an inductor coil can increase the dc (direct current) resistance of the inductor. The resistance increase is inversely proportional to the decrease in thickness. At the same time, the self-inductance of a conductor trace having a rectangular cross section increases far more slowly than the resistance. The self-inductance of a conductor having a rectangular cross-section generally has an inverse relationship to conductor thickness, but depends on conductor thickness in a more complicated manner than the resistance.

Increased resistance due to reduction of conductor thickness with an essentially flat inductance will lower quality factor (Q-factor) of the inductor. The inductive Q is defined as the ratio of energy stored in the magnetic field to the energy dissipated by inductor resistance. In practice, Q is a frequency-dependent quantity. For some exemplary applications, the Q is measured at frequencies above 100 MHz, typically at 140 MHz. The inductor resistance, denoted by Rac, is frequency dependent due to the skin effect. The dc resistance, Rdc, is a benchmark parameter that is indicative of Rac. As Rdc is inversely proportional to the cross-sectional area of the conductor, Rac is also inversely proportional to the conductor cross section. Rac is reduced due to the larger circumferential dimensions associated with a larger cross sectional area.

A lowered inductor Q resulting from a reduced conductor thickness as well as footprint and thus higher Rdc and Rac, increases resistive loss of the inductor. Higher inductor losses impact the overall performance of the FIVR, as efficiency is diminished. Larger inductance can compensate the increased resistance, but increasing inductance can involve greater conductor lengths and space limitations may impose restrictions on conductor lengths.

Noting the self-inductance of the conductors are a weak function of cross-section, a robust approach toward increasing self-inductance is to embed the conductors in a magnetic core material. This approach generally affords a decrease in overall inductor dimensions while maintaining a high self-inductance. An increased self-inductance is beneficial for reducing ripple current that is output from the FIVR, as the choking action of the inductor is a function of its self-inductance. The filtering action of the inductor in combination with filter capacitors also improves with the self-inductance of the inductor. However, Rdc and Rac are increased, even further, as the cross-sectional dimensions of the conductor are reduced. When handling large currents, the losses due to high Rdc, for example can be large enough to significantly degrade FIVR efficiency, requiring higher power consumption, as well as generating excessive heat.

As described further below, thick inductors, referred to as "trench inductors", are embedded in a package-integrated magnetic core, without increasing the package layer count. The thick inductors are fabricated by forming the conductors in extended vias or trenches, spanning adjacent conductor layers. The adjacent conductor layers and the fill metal between them may then act as a single low resistance conductive path. An inductor so formed may therefore have tall vertical sidewalls, with a z-height equal to the combined thicknesses of the trench and one or two vertically displaced traces. In some embodiments, a thick inductor formed in this manner comprises a span of conductive material between vertically displaced traces separated by a dielectric magnetic core. Accordingly, a trench formed between traces in adjacent conductor layer may be 25 to 35 microns deep, for example, while traces may be 25 microns thick to 35 microns thick.

In accordance with embodiments herein, the incorporation of thick inductors need not increase overall package thickness. For example, a trench inductor may have a total thickness of up to 85 microns. Currently, the cross-sectional area may be effectively augmented by up to 240% over a single trace inductor. Rdc and Rac may be correspondingly reduced, and greater sidewall coupling may increase positive mutual inductance between adjacent inductors. While increased mutual inductance is an important benefit of the architecture, the decrease in Rdc is equivalent to adding three to four additional layers to the package substrate. Accordingly, embodiments herein may offer an equivalent space savings of up to 150 microns in z-height.

In addition to voltage regulation, the package-integrated thick trench inductors described herein may be incorporated into other functional circuitry, for example as an inductive component into a radio frequency (rf) oscillator circuit, a rf phasing circuit or a rf mixing circuit.

Here, the term "connected" or "interconnected" means a direct connection, such as electrical, mechanical, or magnetic connection between the things that are connected, without any intermediary devices.

Here, the term "coupled" means a direct or indirect connection, such as a direct electrical, mechanical, or magnetic connection between the things that are connected or an indirect connection, through one or more passive or active intermediary devices.

Here, the term "package" generally refers to a self-contained carrier of one or more dies, where the dies are attached to the package substrate, and encapsulated for protection, with integrated or wire-boned interconnects between the die(s) and leads, pins or bumps located on the external portions of the package substrate. The package may contain a single die, or multiple dies, providing a specific function. The package is usually mounted on a printed circuit board for interconnection with other packaged ICs and discrete components, forming a larger circuit.

Here, the term "substrate" refers to the substrate of an IC package. The package substrate is generally coupled to the die or dies contained within the package, where the substrate comprises a dielectric having conductive structures on or embedded with the dielectric. Throughout this specification, the term "package substrate" is used to refer to the substrate of an IC package.

Here, the term "magnetic core" generally refers to a body of magnetic or magnetizable material that provides a region of low reluctance for magnetic flux. It is distinguished from the term "core" or "package core", which generally refers to a stiffening layer generally embedded within of the package substrate, or comprising the base of a package substrate.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The term "microprocessor" generally refers to an integrated circuit (IC) package comprising a central processing unit (CPU) or microcontroller. The microprocessor package is referred to as a "microprocessor" in this disclosure. A microprocessor socket receives the microprocessor and couples it electrically to the PCB.

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional", "profile", "plan", and "isometric" correspond to orthogonal planes within a cartesian coordinate system. Thus, cross-sectional and profile views are taken in the x-z plane, plan views are taken in the x-y plane, and isometric views are taken in a 3-dimensional cartesian coordinate system (x-y-z). Where appropriate, drawings are labeled with axes to indicate the orientation of the figure.

FIG. 1A illustrates a cross-sectional view in the x-z plane of package substrate 100 showing trench inductor 111, according to embodiments of the disclosure.

In the embodiment illustrated in FIG. 1A, package substrate 100 comprises a series of dielectric build-up film laminates. Multiple dielectric film layers comprising a suitable package dielectric 101 may be laminated one at a time over a rigid package core to form a stack of overlaid laminates of package dielectric 101. Over each dielectric film layer, conductive structures such as pads/traces 103 may be formed. An example is a package substrate formed by bumpless build-up layer (BBUL) methodology. The term "bumpless" refers to dielectric layers of substrate and components and conductive structures embedded within the dielectric layers, where no solder balls or bumps are used as means of attachment.

In some embodiments, package dielectric 101 is a monolithic block rather than stack of laminated film. Package dielectric 101 may comprise materials that include, but are not limited to, composite epoxies, liquid crystalline polymers and polyimides. Other suitable materials may be employed. Suitable organic or inorganic materials may be employed. Materials may include FR4 (e.g., epoxy-based laminate), bismaleimide-triazine, polyimide, silicon, etc. In alternative embodiments, package dielectric 101 comprises a molded material, such as, but not limited to, an epoxy resin.

Interlayer vias 102 extend vertically (in the z-direction) within package dielectric 101. In some embodiments, interlayer vias 102 extend within laminate sheets of package dielectric 101 between conductive layers. In some embodiments, interlayer vias 102 interconnect pads/traces 103 within conductor levels N through N-7. In general, the conductor level indicia (e.g., N-7) are referenced to level N, the upper-most conductor level of the package substrate. In some embodiments, conductor level N is at the die side surface of IC package substrate 100. In the illustrated embodiment, conductor level N-7 is at the land side surface of IC package substrate 100. In the illustrated embodiment, conductive level N comprises bond pads 104. In some embodiments, bond pads 104 are first-level interconnect (FLI) pads for flip-chip attachment of IC dies (e.g., die 105). Conductive level N-7 on the opposite side of package substrate 100 comprises land side bond pads 106. Die-side bond pads 104 (e.g., FLI pads) are coupled to die 105 through solder joints 107. Coupling of die 105 to a power source may occur through vertical interconnection between bond pads 104 to land-side bond pads 106 through interlayer vias 102. Bond pads 106 may be coupled to a printed circuit board such as a computer motherboard.

Interlayer vias 102 may be dimensioned to handle current levels commensurate with the type of signal. In general, power signals comprise large currents relative to data signals. In the illustrated embodiment, interlayer vias 102 are shown to have a wide diameter for conducting power signals. As an example, power rails for an integrated circuit, such as a microprocessor 108 on die 105 may be coupled to a 12 volt power supply through a computer motherboard or other printed circuit board to which package substrate 100 is attached. In some embodiments, power rails of microprocessor 108 are coupled FIVR 109, which regulates the voltage at the power rails of microprocessor 108. As an example, FIVR 109 may convert the voltage to the rail from 12 volts from the main power supply to 3.2 volts or 1.8 volts. Current levels carried by interlayer vias 102 may reach peaks of several amperes, requiring interlayer vias 102 to have diameters that are commensurate with the power current levels. In some embodiments, interlayer vias have diameters ranging from 100 to 300 microns.

Package substrate 100 further comprises magnetic core block 110. In the illustrated embodiment, magnetic core block 110 comprises a first portion 110a that is embedded within package dielectric 101, and a second portion 110b that extends over the land side of IC package substrate 100. In some embodiments, first portion 110a comprises a first magnetic material, and second portion 110b comprises a second magnetic material. In some embodiments, magnetic core block 110 comprises a single magnetic material.

In some embodiments, first and second magnetic materials comprise particulate form of a magnetic material within a neutral (non-magnetic, non-conductive) dielectric matrix. In some embodiments, the dielectric matrix is a thermoplastic or thermosetting organic polymer comprising epoxy resins, polyamide resins, polyimide resins, polysulfones. Inorganic materials such as silica filler, silicates, may also be included.

Suitable magnetic materials include, but are not limited to, any of particulate forms of iron, nickel, nickel-iron alloys such as Mu metals and/or permalloys. In some embodiments, magnetic materials comprise lanthanide and/or actinide elements. In some embodiments, magnetic core block 105 comprises cobalt-zirconium-tantalum alloy (e.g., CZT). Suitable magnetic materials may also comprise semiconducting or semi-metallic Heusler compounds and non-conducting (ceramic) ferrites. In some embodiments, ferrite materials comprise any of nickel, manganese, zinc, and/or cobalt cations, in addition to iron. In some embodiments, ferrite materials comprise barium and/or strontium cations. Heusler compounds may comprise any of manganese, iron, cobalt, molybdenum, nickel, copper, vanadium, indium, aluminum, gallium, silicon, germanium, tin, and/or antimony. Heusler alloy, Co, Fe, Ni, Gd, B, Ge, Ga, permalloy, or Yttrium Iron Garnet (YIG), and wherein the Heusler alloy is a material which includes one or more of: Cu, Mn, Al, In, Sn, Ni, Sb, Ga, Co, Fe, Si, Pd, Sb, V, Ru, Cu2MnAl, Cu2MnIn, Cu2MnSn, Ni2MnAl, Ni2MnIn, Ni2MnSn, Ni2MnSb, Ni2MnGa Co2MnAl, Co2MnSi, Co2MnGa, Co2MnGe, Pd2MnAl, Pd2MnIn, Pd2MnSn, Pd2MnSb, Co2FeSi, Co2FeAl, Fe2VAl, Mn2VGa, Co2FeGe, MnGa, MnGaRu, or Mn3X, where 'X' is one of Ga or Ge.

Materials such as Pt, Pd, W, Ce, Al, Li, Mg, Na, Cr2O3, CoO, Dy, Dy2O, Er, Er2O3, Eu, Eu2O3, Gd, Gd2O3, FeO, Fe2O3, Nd, Nd2O3, KO2, Pr, Sm, Sm2O3, Tb, Tb2O3, Tm, Tm2O3, V, V2O3 or epoxy material with particles of a magnetic alloy. A magnetic alloy can be an alloy formed of one or more of: Pt, Pd, W, Ce, Al, Li, Mg, Na, Cr, Co, Dy, Er, Eu, Gd, Fe, Nd, K, Pr, Sm, Tb, Tm, or V.

While some of the magnetic materials are conductors, it is understood that the composite is electrically non-conductive to avoid short-circuiting pads/traces 103 on adjacent conductor levels.

Trench inductor 111 is embedded within magnetic core block 110. In the cross-sectional view of FIG. 1A, trench inductor 111 extends along they axis (e.g., above and below the plane of the figure) through first portion 110a of magnetic core block 110. Trench inductor 111 extend in the z-direction between conductor levels N-6 and N-7 between traces 112 and 113. In some embodiments, trench inductor 111 extends between and is contiguous with traces 112 and 113 within conductor levels N-6 and N-7, respectively. Traces 112 and 113 are part of trench inductor 111, adding to z-height and increasing cross-sectional area. In some embodiments, traces 112 and 113 extend laterally from trench inductor 111 where portions of traces 112 and 113 overhang sidewalls of trench inductor 111 as lateral ridges. The increase in cross section and thereby increase in perimeter enables smaller Rdc and Rac encountered by current moving through trench inductor 111. In some embodiments, traces 112 and 113 overhang the sidewalls, giving an I-beam profile to the cross section, as shown in FIG. 1A.

In some embodiments, trench inductor 111 has a rectangular cross section with an aspect ratio having a z-height greater than the width (extending in the x-direction), presenting sidewalls 106 that have a z-height at least equal to the distance between conductor levels N-6 and N-7. In some embodiments, multiple (two or more) adjacent inductors 111 extending parallel to each other are present within magnetic core block 110, as shown in FIG. 1C. Adjacent sidewalls 106 on each of the adjacent inductors 111 may couple magnetically. Coupling increases with sidewall area, and can increase mutual inductance between adjacent inductors.

Figure 1B:
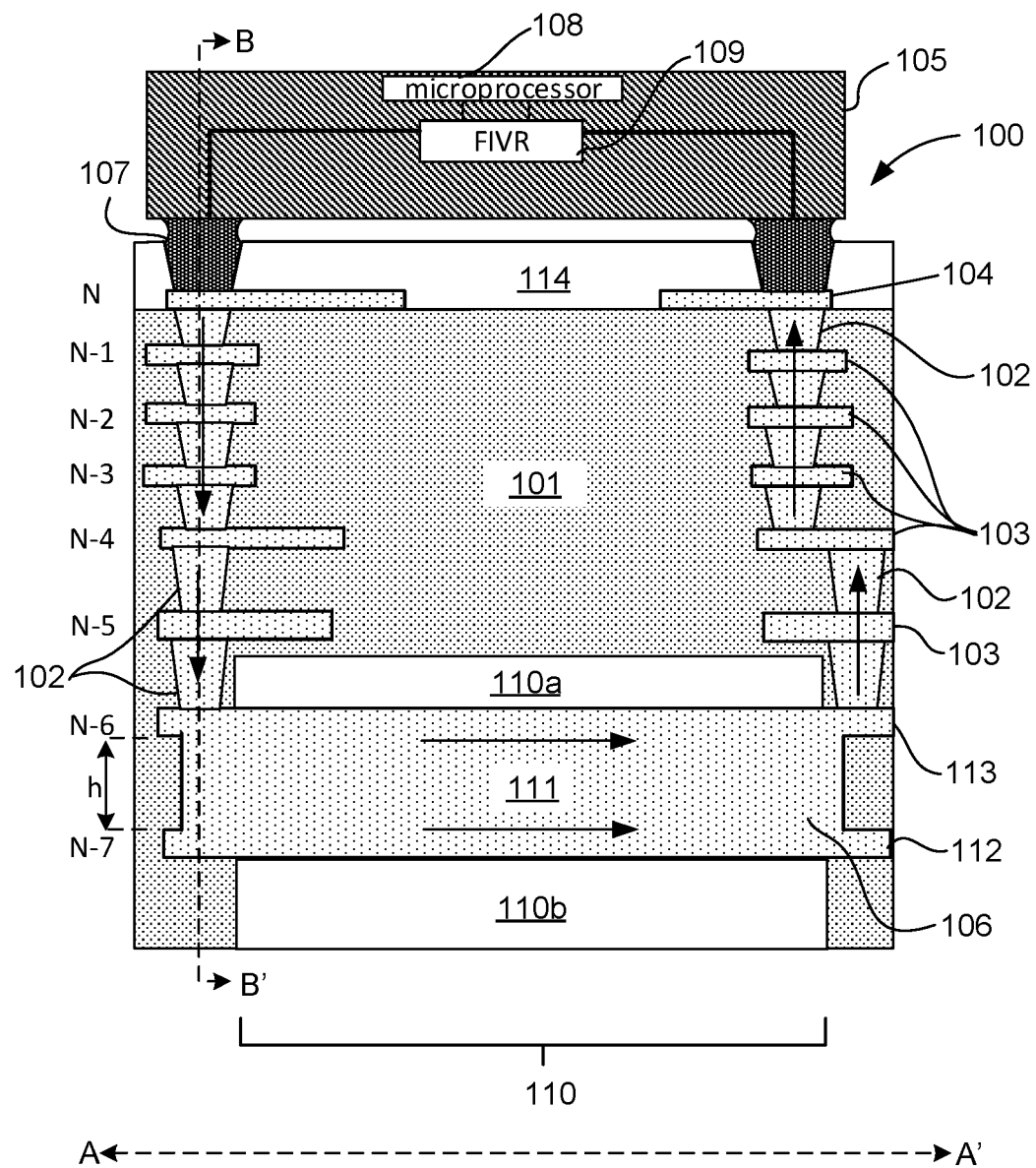
FIG. 1B illustrates a cross-sectional view in the y-z plane of an IC package substrate showing a trench inductor, according to embodiments of the disclosure.
Figure 1C:
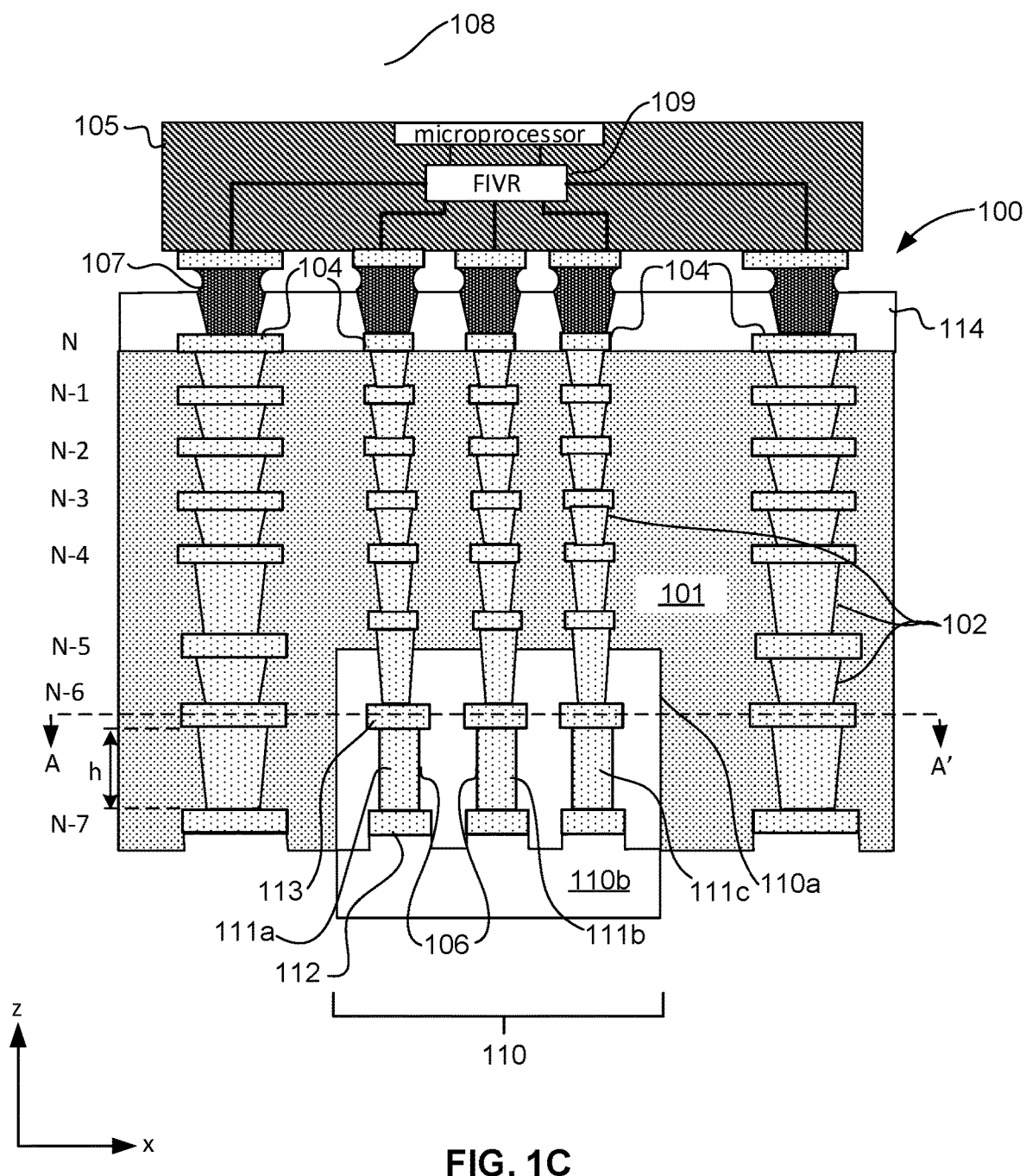
FIG. 1C illustrates a cross-sectional view in the x-z plane of an IC package substrate showing multiple trench inductors, according to some embodiments of the disclosure.

FIG. 1B illustrates a cross-sectional view in the y-z plane of IC package substrate 100 showing trench inductor 111, according to embodiments of the disclosure.

The cross-sectional view in FIG. 1B is taken along cut line A-A' in FIG. 1A. Trench inductor 111 is viewed from the side, showing a cross section of the trench portion of trench inductor 111 extending substantially along the length of trench inductor 111 extending through magnetic core block 110 in the y-direction. First portion 110a of magnetic core block 110 extends over trace 112. Second portion 110b of magnetic core block 110 extends below trace 113. In some embodiments, traces 112 and 113 are contiguous with trench inductor 111, augmenting cross-sectional area over trench inductor alone. By extending in the z-direction between conductor levels N-7 and N-6, the trench section of trench inductor 111 has an increased z-height h (thickness) over a single conductor level trace (e.g., trace 112).

In some embodiments, h ranges between 35 and 50 microns. The cross-sectional area of trench inductor 111 will have a reduced Rdc and Rac in comparison with conventional traces of the same length. In some examples, trench inductor 111 is equivalent to adding three to four additional conductor levels of inductor traces coupled in parallel to IC package substrate 100, which might entail a package thickness increase of 25 to 50 microns each. The extended thickness of trench inductor 111 may afford a significant reduction in Rdc and Rac while maintaining small package z-height.

Vertical interconnects to and from trench inductor 111 to the top conductor level N are provided by interlayer vias 102 and pads/traces 103. Interlayer vias 102 may be stacked between conductor levels N-6 and N, as shown in the illustrated embodiment of FIG. 1B, coupling trench inductor 111 to top-level bond pads 104 in conductor level N.

In the example shown in FIG. 1B, FIVR 109 is coupled to trench inductor 111 through solder joints 107 and interlayer vias 102. In some embodiments, solder joints 107 extend from top-level bond pads 104 through openings in solder mask 114. The arrows that extend through interlayer vias 102 indicate an exemplary current flow path to and from die 110. It is understood that the current is generally a pulsed direct current (dc), which flows in a single direction. While the current is pulsed dc, the frequency (Fourier) spectrum comprises a pure dc component in addition to fundamental and harmonic alternating (ac) components, lending importance to minimizing Rdc.

For clarity, the arrows indicate current flow during the pulse portion of the switching duty cycle. As an example, pulsed current is output through solder joint 107 at a frequency of 140 MHz, and flows into trench inductor 111. In some embodiments, trench inductor 111 is coupled to a switching transistor pair in the IVR (e.g., FIVR 109) circuitry. During operation, current flows through trench inductor 111 on the right side of the figure, returning to die 110 through solder joint 107. Load shunt capacitance in the IVR circuitry is coupled to trench inductor 111 through solder joint 107, and together with trench inductor 111 filters the current to reduce the pulses to a relatively low value of ripple (e.g., 20%) superimposed on a pure dc component.

The amount of ripple voltage or current may be reduced to a suitable predetermined level by choice of the value of self-inductance of trench inductor 111, and shunt capacitance values. For any self-inductance value of trench inductor 111 (mostly determined by the length of the trench inductor 111 and relative magnetic permeability of magnetic core block 110), dissipative losses from Rdc and Rac are minimized by the large cross-sectional area of trench inductor presented to the current, increasing the Q of the inductive component. The power efficiency of the IVR is increased by the low dissipative losses afforded by the large cross section of trench inductor 111 relative to conventional inductors. In some embodiments, the IVR is operated as a buck converter. A counter or buck voltage is generated at both ends of the trench inductor 111 that is somewhat smoothed, and reduces the output voltage of the IVR. In some embodiments, the IVR is operated as a boost converter.

FIG. 1C illustrates a cross-sectional view in the x-z plane of package substrate 100 showing multiple trench inductors 111, according to some embodiments of the disclosure.

In some embodiments, two or more trench inductors 111 are within magnetic core block 110. Magnetic core block 110 comprises first portion 110a embedded within package dielectric 101, and second portion 110b overlaying first portion 110a. In some embodiments, first portion 110a and second portion 110b comprise substantially the same magnetic material. In some embodiments, first portion 110a comprises a magnetic material that is substantially different from the magnetic material comprised by second portion 110b. In embodiments where the compositions differ, the magnetic particles may be the same. The dielectric matrix may be different for reasons concerning the manufacturing process.

In some embodiments, trench inductors 111a-111c are coupled to bond pads 104 in top-most conductive layer N by interlayer vias 102. In the illustrated embodiment, trench inductors 111a-111c extend along the length of magnetic core block 110 in the y-direction, above and below the plane of the figure. Trench inductors 111a-111c are further characterized by an inter-level z-height that is at least the indicated vertical distance h between conductor levels N-6 and N-7 between traces 112 and 113. In some embodiments, traces 112 and 113 extend laterally from trench inductor 111 where portions of traces 112 and 113 overhang sidewalls of trench inductor 111 as lateral ridges. In some embodiments, h is substantially equal to the thickness of a layer of package dielectric laminate, are shown embedded within magnetic core block 110. In some embodiments, multiple trench inductors 111a-c may be electrically coupled in series or parallel, while in alternative embodiments, multiple trench inductors 111a-c are electrically isolated. Embodiments of multiple trench inductors 111 are described below.

The architecture illustrated in FIG. 1C may provide a compact integrated high inductance density inductor array. In some embodiments, multiple trench inductors 111a-c may be individually coupled to separate circuits on die 105. As an example, FIVR 109 is a multiphase system requiring more than one inductive component to be coupled to phased switches. To accommodate a multiphase IVR topology, multiple trench inductors 111a-c may be coupled to three separate phased converter circuits in FIVR 109.

Figure 1D:
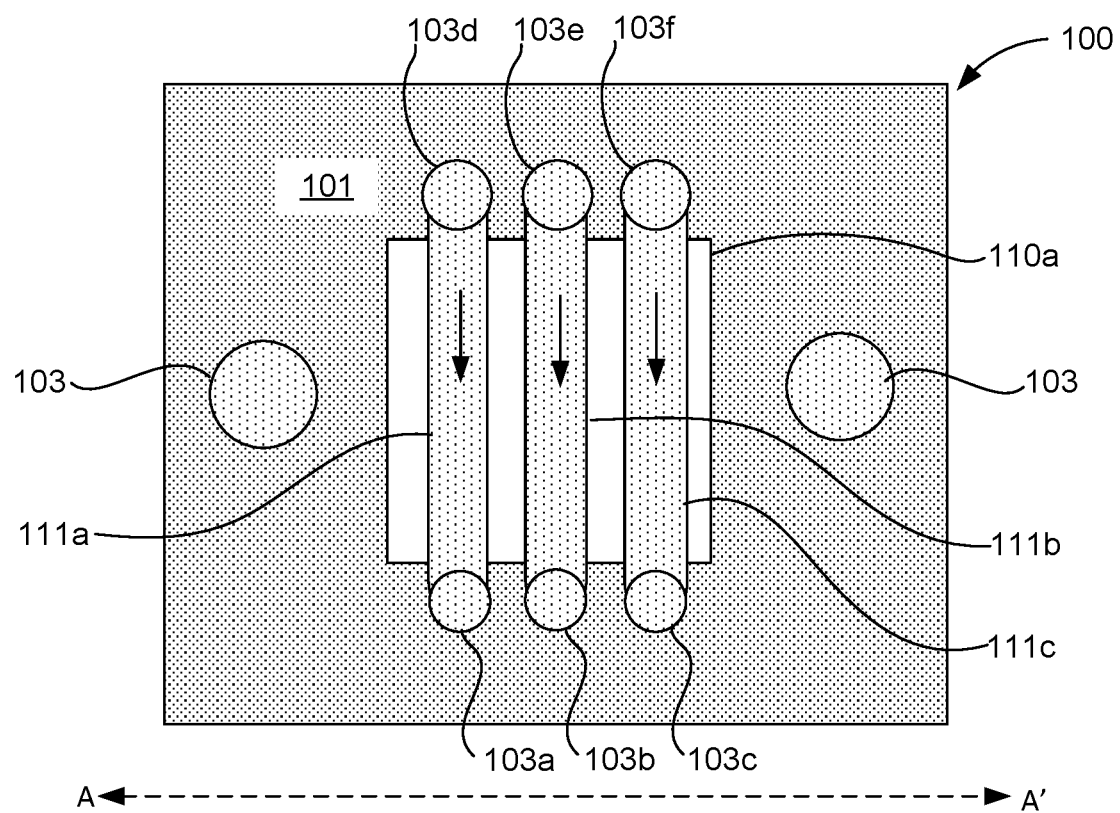
FIG. 1D illustrates a plan view in the x-y plane of an IC package substrate showing separate individual multiple trench inductors, according to some embodiments of the disclosure.

FIG. 1D illustrates a plan view in the x-y plane of IC package substrate 100, showing separate individual multiple trench inductors 111, according to some embodiments of the disclosure.

The plan view of FIG. 1D is taken along cut line A-A' in FIG. 1C, extending through conductor level N-6 and signal pads 103. In some embodiments, multiple trench inductors 111a, 111b and 111c may extend in parallel within magnetic core block 110a, but connected to independent sources, and distribute the independent currents to separate loads, as indicated by the arrows. In an exemplary implementation, three phased currents from a phased IVR circuit may enter the trench inductors 111a-111c through pads 103d, 103d and 103f, respectively, then flow as separate signal paths, exiting though pads 103a, 103b and 103c, respectively. In some embodiments, pads 103a-103f are embedded in package dielectric 101. Pads 103a-103f provide interconnectivity to separate signal routing through intra-layer traces or vertical vias (e.g., interlayer vias 102, not shown) embedded within package dielectric 101, whereby currents, shown by the parallel arrows, exit the individual trench inductors 111a-111c to travel to separate loads.

In some embodiments, individual trench inductors 111a-111c may have different dimensions to present different inductances to the individual currents flowing along them. As indicated by the arrows, parallel currents flow in the same direction, providing positive magnetic coupling between parallel trench inductors 111, thereby providing a positive mutual inductance. The inductance density is increased overall. The large sidewalls of the trench inductors 111, as shown in FIGS. 1A-1C, are particularly useful for enhancing magnetic coupling between parallel trench inductors 111.

Figure 1E:
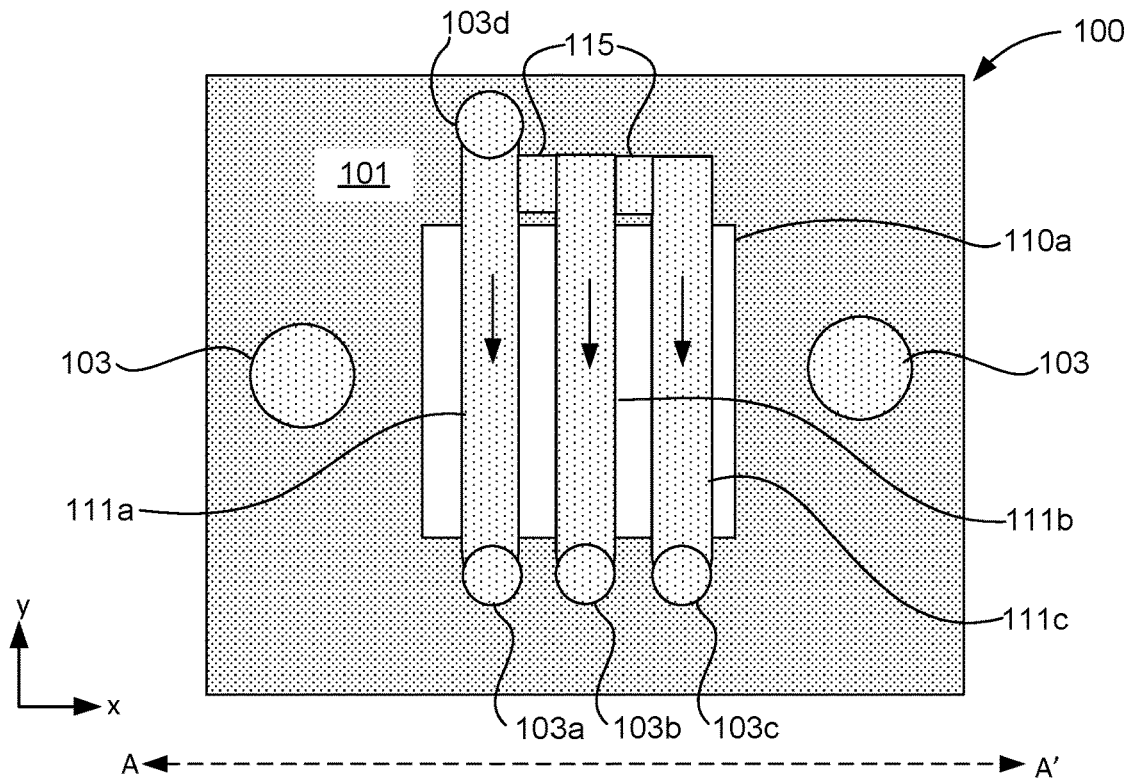
FIG. 1E illustrates a plan view in the x-y plane of an IC package substrate, showing multiple trench inductors connected in parallel, according to some embodiments of the disclosure.

FIG. 1E illustrates a plan view in the x-y plane of IC package substrate 100, showing multiple trench inductors 111 connected in parallel, according to some embodiments of the disclosure.

The plan view of FIG. 1E is taken along cut line A-A' in FIG. 1C, extending through conductor level N-6 and signal pads 103. In some embodiments, multiple trench inductors 111 extend in parallel through magnetic core block 110 may be electrically connected in parallel to distribute current to separate loads, as indicated by the arrows. FIG. 1E shows trench inductors 111a, 111b and 111c connected in parallel by bridge traces 115. In an exemplary implementation, current flowing from a signal source, such as an IVR, may enter the inductor at pad 103d, and be distributed to the individual trench inductors 111a, 111b, and 111c as separate signal paths. In some embodiments, pads 103a, 103b and 103c are embedded within package dielectric 101, providing interconnectivity to separate signal routing through intra-layer traces or vertical vias (e.g., interlayer vias 102, not shown) embedded within package dielectric 101, whereby currents, shown by the parallel arrows, exit the individual inductors 111a-111c to travel to separate loads.

In some embodiments, individual trench inductors 111a-111c may have different dimensions to present different inductances to the individual currents flowing along them. As parallel currents are flowing in the same direction, mutual inductance is positive, due to positive magnetic coupling between adjacent trench inductors 111. The large sidewalls of the trench inductors 111, as shown in FIGS. 1A-1C, are particularly useful for enhancing mutual coupling.

Figure 1F:
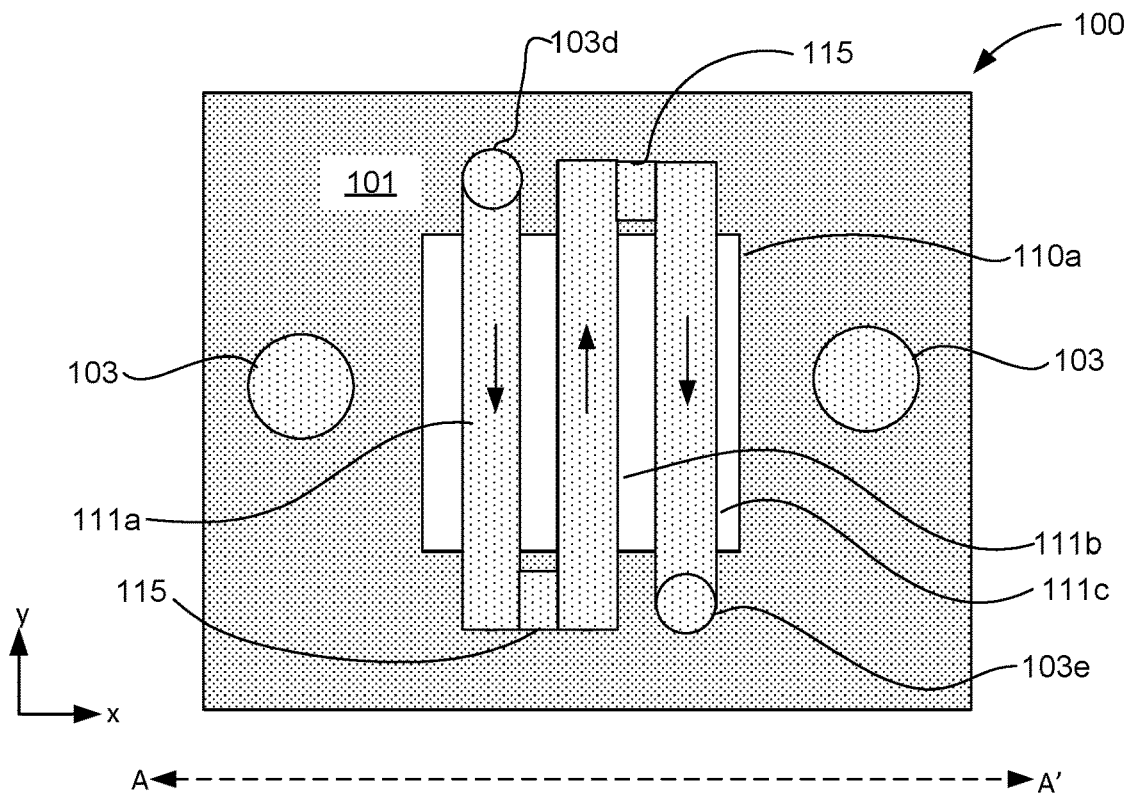
FIG. 1F illustrates a plan view in the x-y plane of an IC package substrate, showing multiple trench inductors connected in series, according to some embodiments of the disclosure.

FIG. 1F illustrates a plan view in the x-y plane of IC package substrate 100, showing multiple trench inductors 111 connected in series, according to some embodiments of the disclosure.

The plan view of FIG. 1F is taken along cut line A-A' in FIG. 1C, extending through conductor level N-6 and signal pads 103. In some embodiments, multiple trench inductors 111 may be connected in series within magnetic to increase inductance. FIG. 1E shows trench inductors 111a, 111b and 111c connected in series by bridge traces 115, forming a rectilinear serpentine inductor. In some embodiments, bridge traces 115 may be curved, forming a curvilinear serpentine inductor.

In an exemplary implementation, current, from a signal source, such as an IVR, may enter the inductor at pad 103d, and flow through interconnected individual trench inductors 111a, 111b, and 111c as a single signal path, indicated by the arrows drawn in each trench inductor 111a-111c. In the illustrated embodiment, current exits the serpentine inductor from pad 103e. In some embodiments, pads 103d and 103e are embedded in package dielectric 101, providing interconnectivity to separate signal routing through intra-layer traces or vertical vias (e.g., interlayer vias 102, not shown) embedded within package dielectric 101, whereby currents exit the serpentine inductor comprising the individual trench inductors 111 to travel to a load.

The inductance of the package-integrated inductor may be increased by a factor that is approximately equal to the number of individual inductors 111 connected in series, minus negative mutual inductance due to negative magnetic coupling from oppositely flowing currents in proximity, as indicated by the opposing arrows. While the illustrated embodiment shows three trench inductors connected in series, it is understood that any number of individual trench inductors 111 may be connected in series to achieve a desired inductance. In some embodiments, the individual trench inductors 111 share a magnetic core block (e.g., magnetic core block 110a) as depicted. In some embodiments, individual trench inductors 111 may extend through separate magnetic cores.

Figure 2A:
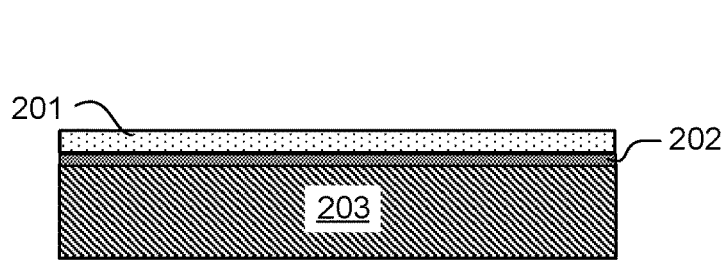
FIGS. 2A-2O illustrate an exemplary method for making a trench inductor in an embedded magnetic core, according to some embodiments of the disclosure.
Figure 2B:
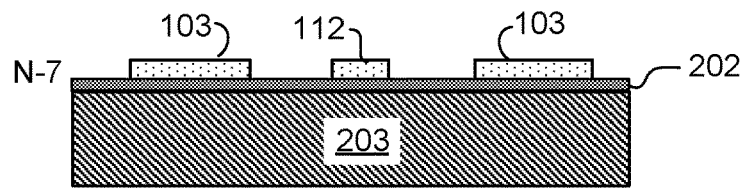
Figure 2C:
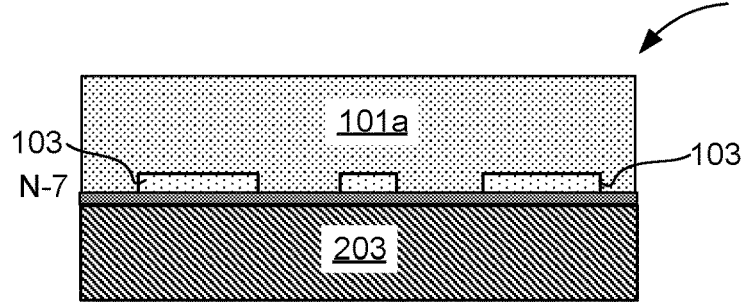
Figure 2D:
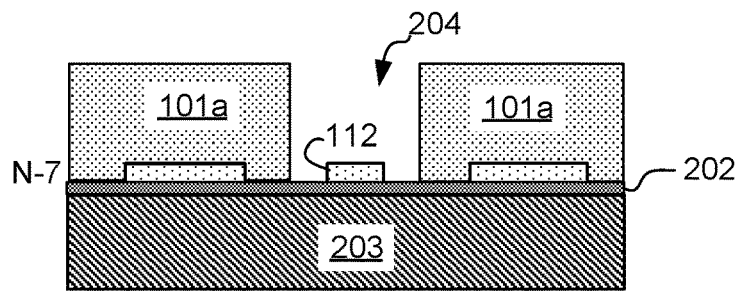
Figure 2E:
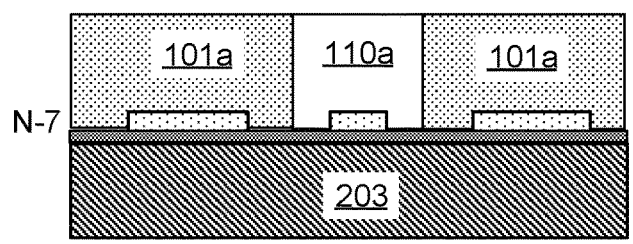
Figure 2F:
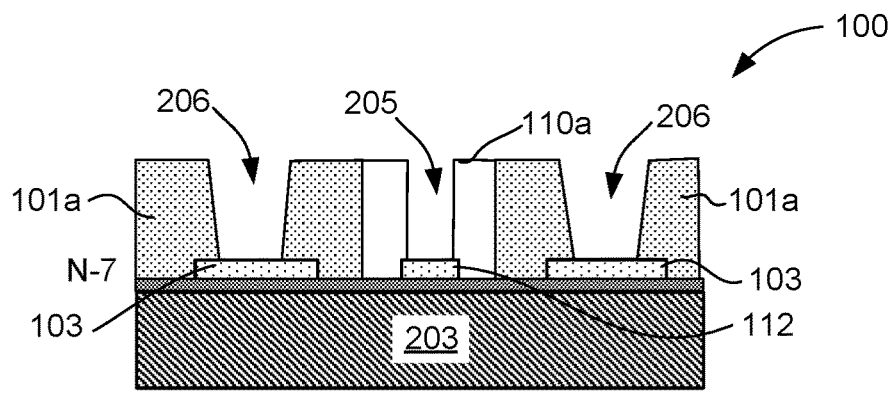
Figure 2G:
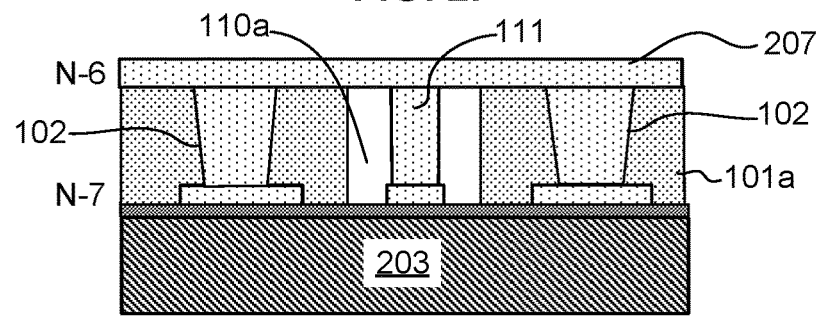
Figure 2H:
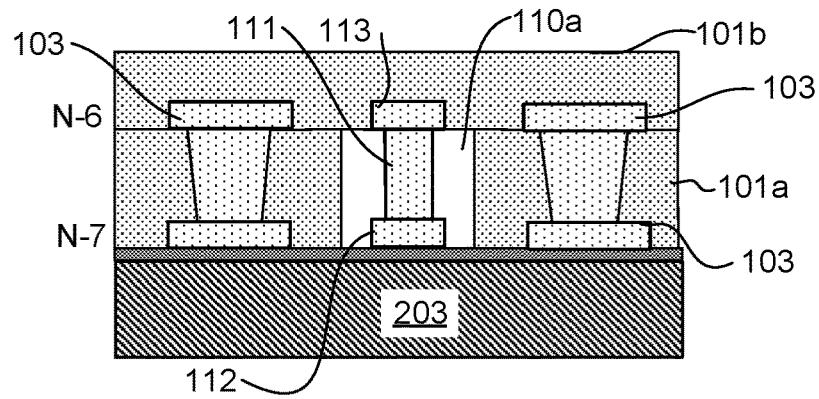
Figure 2I:
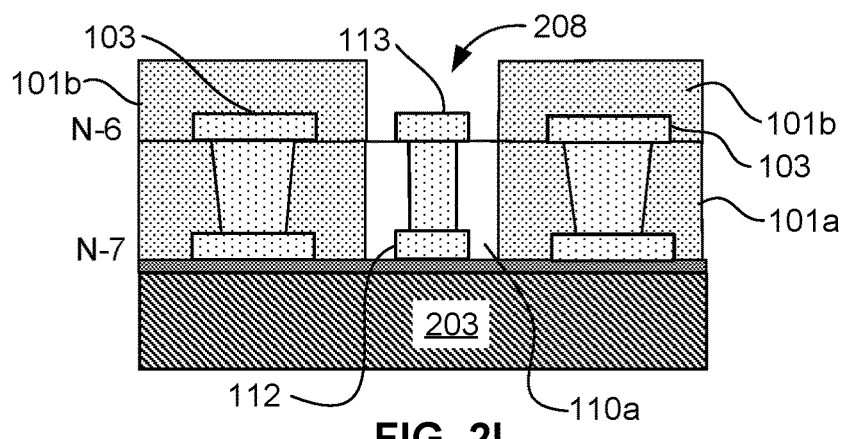
Figure 2J:
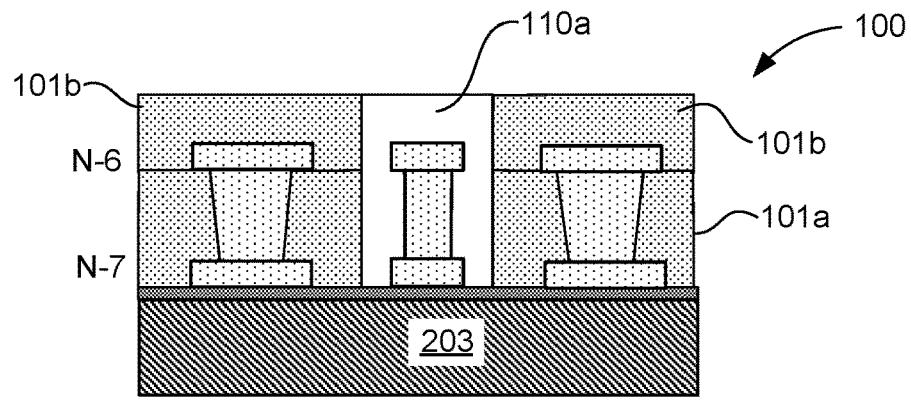
Figure 2K:
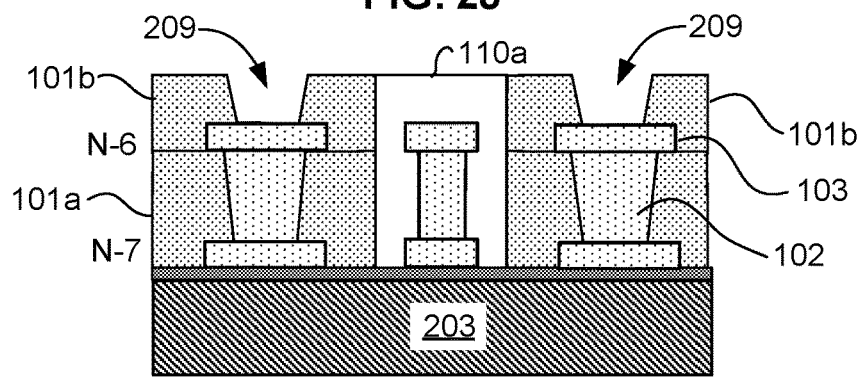
Figure 2L:
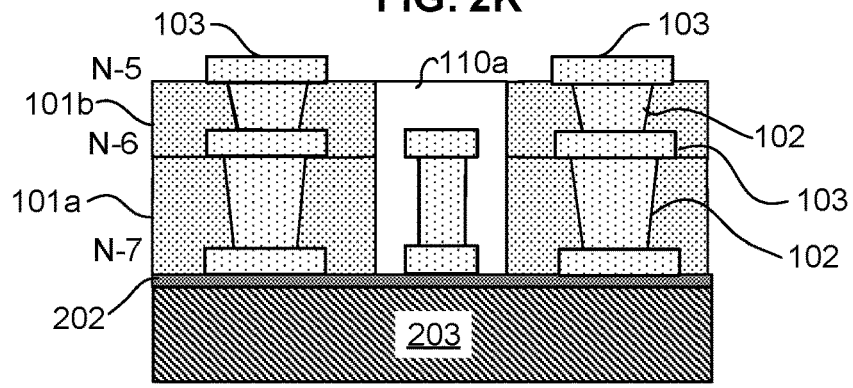
Figure 2M:
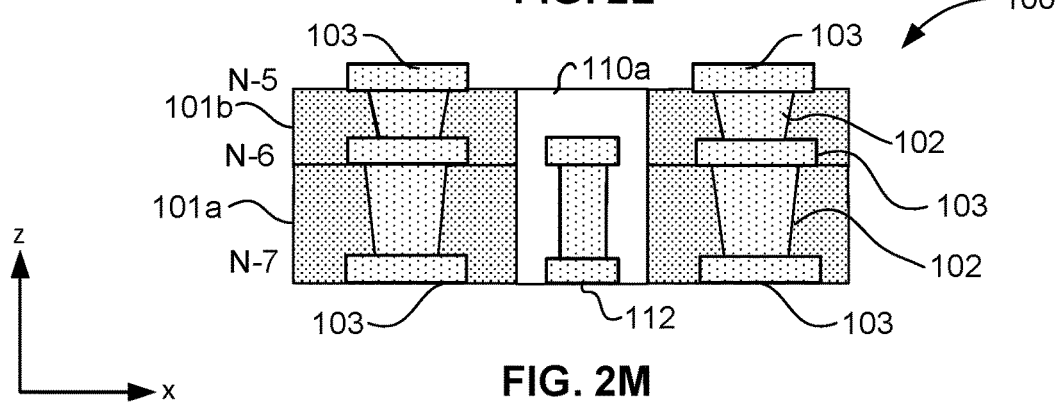
Figure 2N:
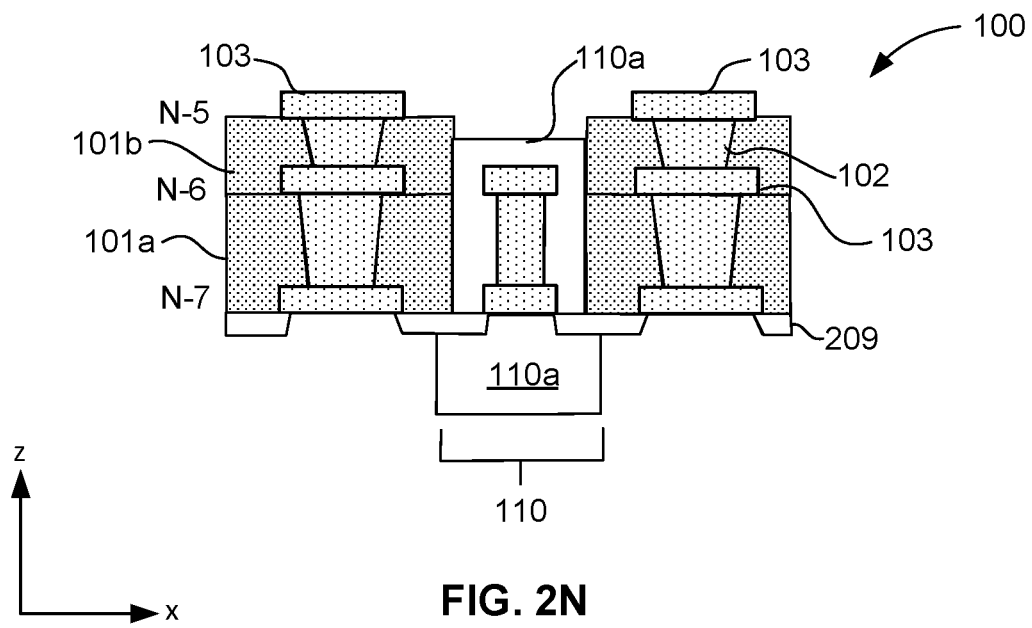
Figure 2O:
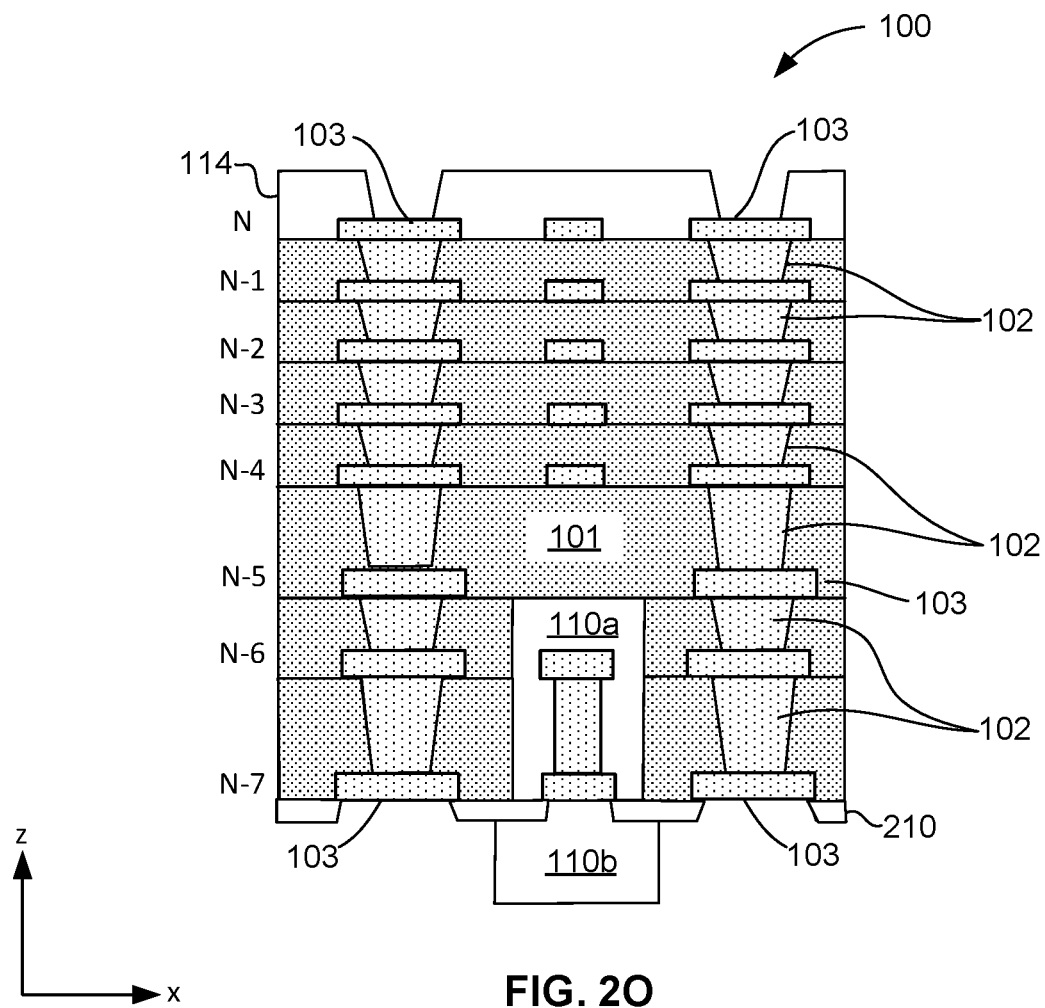

FIGS. 2A-2O illustrate an exemplary method for making trench inductor 111 in embedded magnetic core block 110, according to some embodiments of the disclosure.

In the operation shown in FIG. 2A, conductor layer 201 is formed over a sacrificial metal layer 202 that is overlays package substrate core panel 203 of package substrate 100. In some embodiments, package substrate core panel 203 comprises a stiff dielectric material, such as epoxy resin fiberglass. In some embodiments, sacrificial metal layer 202 comprises copper foils adhered to at least one side of package substrate core panel 203. In some embodiments, sacrificial metal layer 202 is on both sides of package substrate core panel 203. In some embodiments, conductor layer 201 is formed by electroplating methods, and comprises any of copper, silver, gold, nickel, cobalt or tungsten. In some embodiments, conductor layer 201 has a thickness ranging between 15 microns and 35 microns.

In the operation shown in FIG. 2B, conductor layer 201 is patterned to form pads/traces 103. Trace 112 is the lower trace for trench inductor 111 to be formed in a subsequent process operation. Patterning may be performed by lithographically defining features such as pads and traces. Lithographic techniques may be employed to form an etch mask from a photoresist deposited over conductor layer 201. In some embodiments, the etch mask is formed from a dry film resist laminated over package substrate core panel 203. In some embodiments, the etch mask is formed from a photoresist that is deposited by spin coating methods. Conductor layer 201 may be etched by a variety of suitable etching methods. As an example, an etchant comprising iodide ions and iodine may be employed to etch copper. In subsequent steps, the etch mask is removed by photoresist stripping methods.

In the operation shown in FIG. 2C, first dielectric film 101a is laminated over conductive structures (e.g., pads/traces 103) on package substrate core panel 203. First dielectric film 101a may be the first of several dielectric laminate films to build up the IC package substrate 100. Dielectric laminates may comprise epoxies, polyimides and polyamides, as well as liquid crystalline polymers, and are applied as flexible sheets that are laminated over stiff core materials such as package substrate core panel 203. Lamination may be performed at elevated temperatures on a lamination machine to form a conformal layer over pads/traces 103.

In the operation shown in FIG. 2D, cavity 204 is formed in first dielectric film 101a in preparation for formation of a magnetic core block (e.g., magnetic core block 110). Trace 112 is exposed by the cavity formation, where trace 112 is to be embedded in magnetic core material in a subsequent process operation. In some embodiments, cavity 204 is formed by drilling into first dielectric film 101a. In some embodiments, laser drilling is employed. Sacrificial metal layer 202 may act as a laser stop to prevent damage to package substrate core panel 203. Cavity 204 has dimensions of ranging between 500 microns to 2000 microns in the x and y directions. In some embodiments, cavity 204 has a z-height that is the same as the thickness of first dielectric layer 101a, which has a thickness that ranges between 20 microns to 60 microns.

In some embodiments, pad/trace 112 is exposed at the base of cavity 204. Pad trace 112 may be coupled to a power source for electrodeposition of a trench via formed in a subsequent operation.

In the operation shown in FIG. 2E, cavity 204 is backfilled with a first magnetic material to form magnetic core block first portion 110a, sandwiched between portions of first dielectric film layer 101a. In some embodiments, first magnetic material comprises particulates of magnetic or magnetizable material, such as those disclosed above (e.g., see description relating to FIG. 1A) mixed in a polymeric or an inorganic matrix. In some embodiments, the matrix comprises a curable epoxy resin. In some embodiments, the matrix is cured by a thermal treatment. In some embodiments, the matrix is cured by exposure to light (e.g., ultraviolet).

In some embodiments, uncured magnetic material is backfilled into cavity 204 as a paste. The paste may be dispensed through nozzles of a dispensing device.

In the operation shown in FIG. 2F, via trench 205 is formed in magnetic core block first portion 110a to expose trace 112. In some embodiments, laser drilling is employed to form the trench by overlap drilling. Overlap drilling may be performed by displacing the drill by a less than a drill diameter for each penetration along the y-direction in the figure. For laser drilling, trace 112 may be a laser stop, preventing ablation of underlying material. Trench 205 may have dimensions ranging between 10 and 200 microns in the x-direction, and 500 to 2000 microns in the y-dimension. Trench 205 may extend into surrounding package dielectric material (e.g., first package dielectric layer 101a).

In some embodiments, openings 206 are formed in first dielectric film layer 101a over pads/traces 103 for formation of signal vias that are to be electroplated in a subsequent operation. In some embodiments, openings 206 are drilled in a single step by laser drilling. Pads/traces 103 may provide laser stops to prevent damage to underlying layers. Pads/traces 103 and 112 may be coupled to a power source for electroplating of vias in a subsequent operation.

In the operation shown in FIG. 2G, trench inductor 111 and vias 102 are plated into via trench 205 and via openings 206, respectively. Plated materials include copper, nickel, gold, silver, tungsten and cobalt. Plating is performed until vias 102 and trench inductor 111 fill the openings and reach the top surface of first dielectric layer film 101a. In some embodiments, plating continues to form second conductor layer 207 over the surface of first dielectric layer film 101a, and magnetic core block first portion 110a, corresponding to conductor level N-6 in FIGS. 1A-1C. In some embodiments, second conductor layer 207 has a thickness that ranges between 15 microns and 35 microns. At this point, vias 102 and trench inductor 111 are connected together through second conductor layer 207.

In the operation shown in FIG. 2H, an electroplating operation is performed, filling trench 205 with conductor that is part of trench inductor 111. Second conductor layer 207 is plated over dielectric 101a and trench inductor 111. In some embodiments, second conductor layer 207 is a copper layer that has a thickness ranging from 15 to 35 microns. In a following operation, second conductor layer 207 is patterned into conductive structures including pads/traces 103. Trace 112 is the upper trace of trench inductor 111. The same lithographic etch process that was used to pattern the first conductor layer (e.g., first conductor layer 201 in FIG. 2A) may be employed to pattern second conductor layer 207. Subsequent to formation of pads/traces 103 in conductor level N-6 is lamination of second dielectric film layer 101b. As with first dielectric film layer 101a, second dielectric film layer 101b is conformal over structures in conductor layer N-6.

In the operation shown in FIG. 2I, second cavity 208 is formed over the top of magnetic core block first portion 110a, exposing trace 113. In some embodiments, second cavity 208 is formed by laser drilling, as described for formation of the first cavity (e.g., cavity 204 in FIG. 2D). Trace 113 may provide a laser stop to prevent ablation of underlying material. In some embodiments, trace 113 may overhang trench inductor 111. In alternate embodiments, trace 113 may be flush with the sidewalls of trench inductor 111.

In the operation shown in FIG. 2J, second cavity 208 is backfilled with magnetic material to raise the z-height of magnetic core block first portion 110a to the top of second dielectric film layer 101b, fully embedding trench inductor 111 within magnetic core block first portion 110a. Maintaining a portion of the magnetic core block elevated above trench inductor 111 permits flux concentration within the core block and minimizing leakage flux from extending into the package dielectric. This geometry also increases the inductance density of the inductor structure. A variety of suitable methods may be employed to backfill the magnetic material, such as dispensing of a curable magnetic paste, as described for FIG. 2E. In some embodiments, the second backfill material is substantially the same as the first backfill material.

In the operation shown in FIG. 2K, via openings 209 are formed in second dielectric film layer 101b over pads/traces 103 in conductor level N-6. Vias are to be electroplated within via openings 209. In some embodiments, via openings are laser drilled as done for creation of vias 102 between conductor levels N-7 and N-6.

In the operation shown in FIG. 2L, vias 102 are formed in via openings 209 between conductor levels N-6 and N-5, extending through dielectric film layer 101b. In some embodiments, third conductor layer is formed during deposition of vias 102. In some embodiments, the third conductor layer (not shown) is patterned to form pads/traces 103 in conductor level N-5 over vias 102. In some embodiments, when vias 102 reach the top of via openings 209 during electroplating and mushroom over the surface of second dielectric film layer 101b, forming pads over vias 102.

In the operation shown in FIG. 2M, nascent package substrate 100 is freed from package substrate core panel 203 by a depanel process, opening the land side of package substrate 100. In some embodiments, package substrate core panel 203 may be removed by mechanical or chemical attack on sacrificial metal layer 202. The land side contacts comprising pads/traces 103 and trace 112 on the lower portion of trench inductor 111 are exposed by the removal of package substrate core panel 203.

In the operation shown in FIG. 2N, second portion 110b of magnetic core block 110 is deposited below first portion 110a. In some embodiments second portion 110b extends below the bottom side of package substrate 100, partially covering solder resist layer 210, deposited in a previous operation. In some embodiments, second portion 110b is deposited by an ink-jet printing process. In some embodiments, second portion 110b comprises substantially the same magnetic material that is comprises by first portion 110a. In some embodiments, second portion comprises a polymeric matrix that has a lower viscosity in the uncured state than the matrix of first portion 110a, to facilitate printing of the material. In some embodiments, solder resist layer 210 is deposited and patterned in an operation preceding the deposition of second portion 110b, to form solder ball pockets over traces/pads 103 in conductor level N-7.

In the operation shown in FIG. 2O, build-up of package substrate 100 is continued to completion of the package embodiment shown in FIGS. 1A-1C. In the illustrated embodiment, an additional five conductor levels (e.g., conductor levels N-4 through N) are added. Solder bumps are not shown in FIG. 2O, but mask 114 on the die side and solder resist layer 210 on the land side are patterned to receive bumps over die and land side pads 103.

Figure 3A:
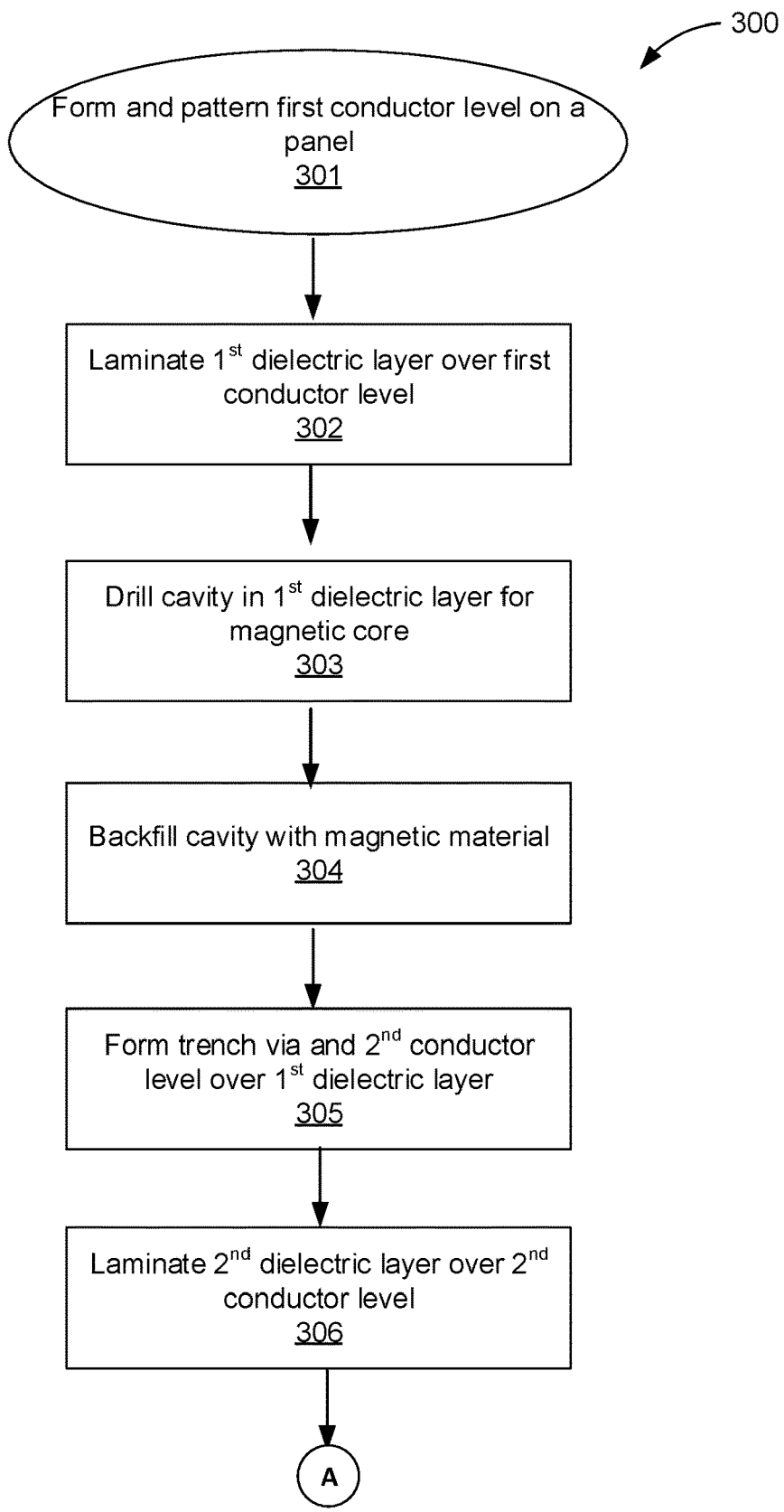
FIGS. 3A-3B illustrate a flow chart summarizing the exemplary method described in detail by FIGS. 2A-2O, according to some embodiments of the disclosure.
Figure 3B:
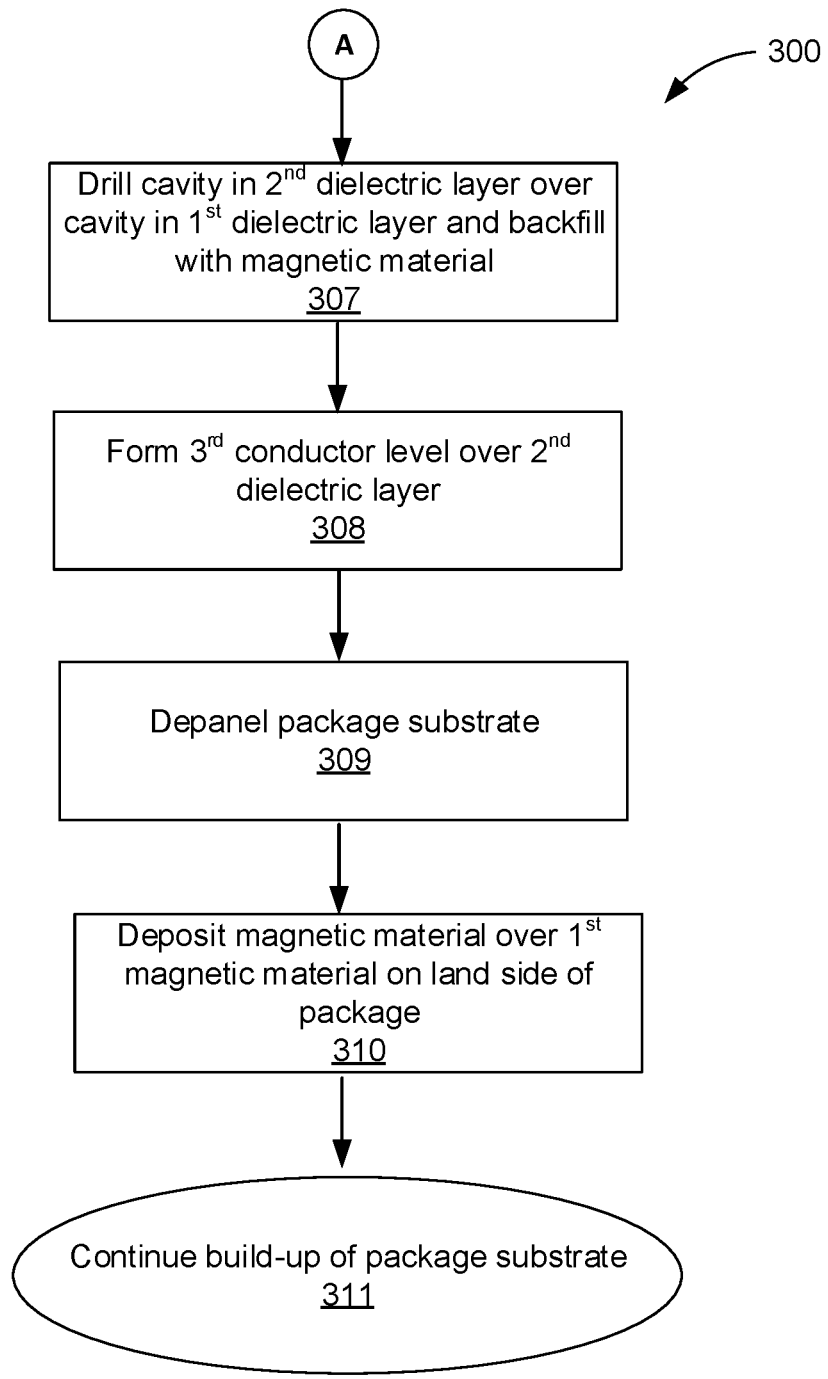

FIGS. 3A-3B illustrate flow chart 300 summarizing the exemplary method described in detail by FIGS. 2A-2O, according to some embodiments.

At operation 301, a package substrate panel is received having a sacrificial metal layers on at least one side. (e.g., copper foils on package substrate core panel 203 in FIG. 2A). A first package conductor level is electroplated over the sacrificial metal layer(s) to a thickness ranging between 15 microns to 35 microns. Lithographically-defined features (e.g., pads/traces 103 in FIG. 2B) are patterned in the first conductor level.

At operation 302, a first dielectric film layer (e.g., first dielectric film layer 101a in FIG. 2C) is laminated over the first conductor level to form the first dielectric layer of a build-up package substrate (e.g., IC package substrate 100). The first dielectric film layer is a conformal layer so that minimal gaps are present between the dielectric and metallization features.

At operation 303, a cavity (e.g., cavity 204 in FIG. 2D) is formed in the first dielectric film layer. The cavity is made in preparation for the formation of an embedded magnetic core block. The drilling operation may be performed by a variety of methods, including drilling, wet etch and dry etch methods. In some embodiments, the cavity is formed by laser drilling, where the laser beam drills into the dielectric layer to the metal layers, which act as a laser stop. The laser beam may then be stepped laterally by a half diameter and drill an overlapping hole. The operation may be repeated in both lateral dimensions (e.g., x and y directions) until the cavity is made to the predetermined dimensions (e.g., 500 to 2000 microns).

At operation 304, the cavity is backfilled with magnetic material to form a portion of the magnetic core block (e.g., first portion 110a in FIG. 2E). In some embodiments, the magnetic material comprises particles of a magnetic material or magnetizable material suspended in a non-magnetic matrix material. In some embodiments, the matrix is a one of a polymer, an inorganic material, or a composite. The magnetic material may be deposited within the cavity as a curable paste and is solidified by a thermal or optical treatment.

At operation 305, a via trench is formed in the magnetic core block in preparation for the formation of a trench inductor within the magnetic core block. The via trench (e.g., via trench 205 in FIG. 2F) is formed by overlap laser drilling to maintain tight dimensional tolerances and straight sidewalls. The trench is drilled down to the first conductor level in order to access metallization features (e.g., pad/trace 112 in FIG. 2F) that may be coupled to a power source for electroplating metal into the via trench. Via holes outside of the magnetic core block may be made at this time in the first dielectric layer for electroplating via interconnects for vertical conveyance of power or data signals.

In some embodiments, trench inductor (e.g., trench inductor 111) and vias are electroplated into their respective trench or openings. In some embodiments, a seed layer is deposited over the dielectric to enhance electroplating. In addition to vias, a second conductor level is electroplated over the dielectric and patterned.

At operation 306, a second dielectric layer (e.g., dielectric film layer 101b in FIG. 2H) is laminated over the second conductor level (e.g., conductor level N-6). The second dielectric layer is laminated conformally over metallization features of the second conductor level.

At operation 307, a cavity (e.g., cavity 208 in FIG. 2I) is drilled in the second dielectric layer over the first portion of the magnetic core block (see FIG. 2I). The cavity is backfilled with magnetic material that is substantially the same as the magnetic material in the magnetic core block. The backfill in the cavity in the second dielectric layer fully embeds the trench inductor within the magnetic core. The headspace of magnetic core over the trench inductor concentrates magnetic flux close to the trench inductor, and may reduce leakage flux from coupling with other conductors within the package.

At operation 308, a third conductor level (e.g., conductor level N-5 in FIG. 2L) is formed over the second dielectric layer and the magnetic core block and patterned to form pads and traces. In some embodiments, the third conductor level is formed by electrodeposition over a seed layer, and patterned by a lithographically-defined etch process.

At operation 309, the nascent package is removed from the package substrate panel (e.g., see FIG. 2M). In some embodiments, the panel (e.g., package substrate core panel 203 in FIG. 2L) is removed by mechanical or chemical detachment of the sacrificial copper foils. The sacrificial metal layers may be etched off of the separated package substrate by an etch process that targets the sacrificial layers, and avoids etching the lower-most (land side) conductor level (e.g., conductor level N-7).

At operation 310, a second portion of magnetic core block (e.g., second portion 110b of magnetic core block 110) is formed by depositing a magnetic material over the first portion (e.g., first portion 110a of magnetic core block 110) of the magnetic core block (e.g., magnetic core block 110 in FIG. 2N)). In some embodiments, the second portion of the magnetic core block is formed on the land side of the package substrate, below the first portion previously formed in the cavity and embedded in the package dielectric.

In some embodiments, the second portion of the magnetic core block is deposited by a printing process, such as ink jet printing over the first portion of the magnetic core block. In some embodiments, the magnetic material extends below conductor level N-7, the lower-most conductor level on the land side of the package substrate, and not embedded in the package dielectric. In some embodiments, the second portion is at least partially embedded. In some embodiments, the magnetic material comprised by the second portion is substantially the same as the magnetic material comprised by the embedded first portion. In some embodiments, the magnetic material of the second portion comprises a matrix that is substantially different from the matrix of the first portion. As an example, the matrix material may be a liquid polymer that has a lower viscosity (compared to a magnetic paste) to enable printing of the material.

At operation 311, formation of the trench inductor is complete. The package build-up process is continued by addition of dielectric layers and formation of higher conductor levels (e.g., conductor levels N-4 through N in FIG. 20).

Figure 4:
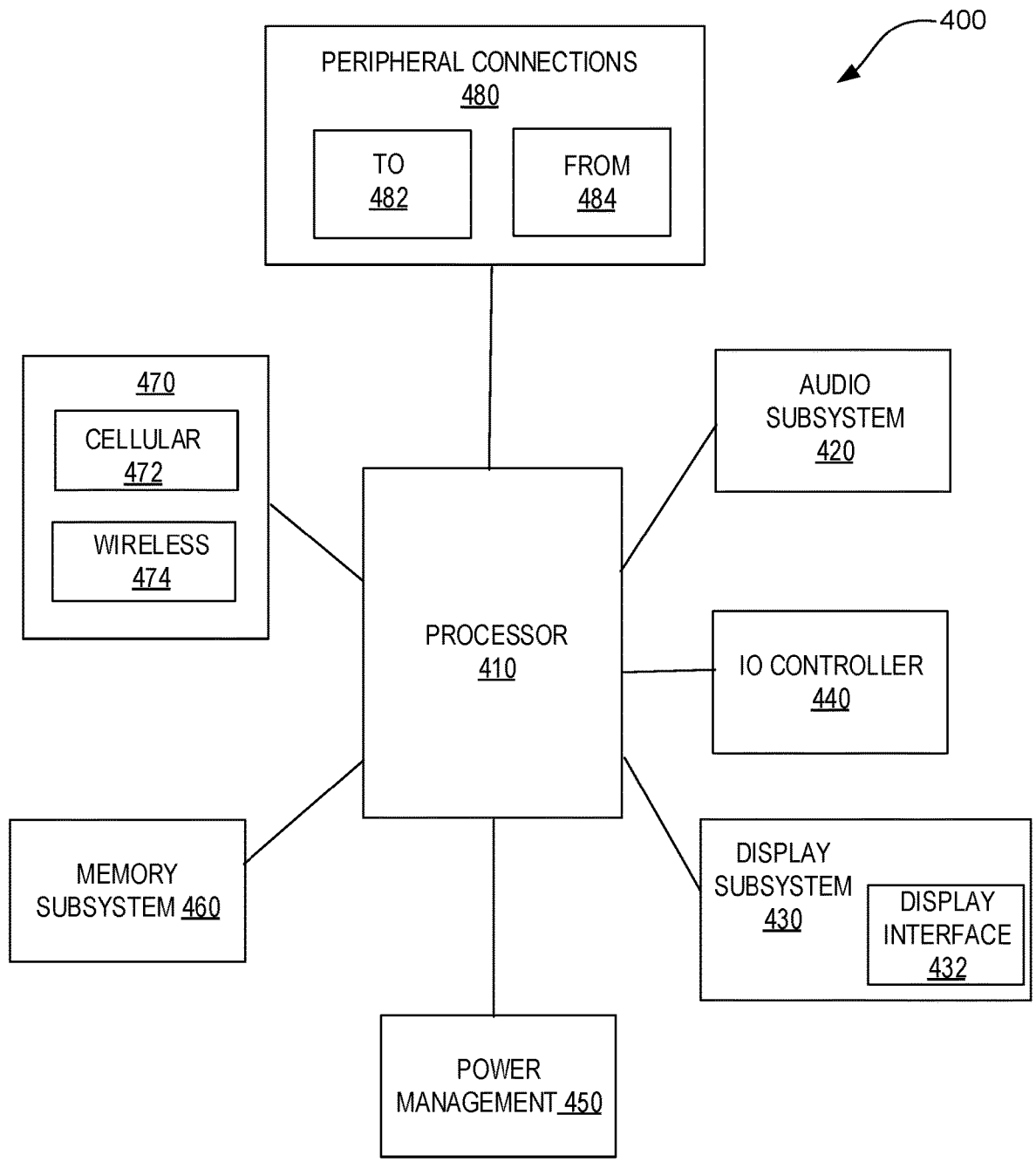
FIG. 4 illustrates a package having one or more integrated trench inductors (e.g., trench inductor 111), fabricated according to the disclosed method, as part of a system-on-chip (SoC) package in an implementation of computing device, according to some embodiments of the disclosure.

FIG. 4 illustrates a package having one or more integrated trench inductors (e.g., trench inductor 111), fabricated according to the disclosed method, as part of a system-on-chip (SoC) package in an implementation of computing device, according to some embodiments of the disclosure.

In some embodiments, computing device 400 represents a mobile computing device, such as a computing tablet, a mobile phone or smart-phone, a wireless-enabled e-reader, or other wireless mobile device. It will be understood that certain components are shown generally, and not all components of such a device are shown in computing device 400.

In some embodiments, computing device 400 includes a first processor 410 that comprises at least one FIVR. The various embodiments of the present disclosure may also comprise a network interface within 470 such as a wireless interface so that a system embodiment may be incorporated into a wireless device, for example, cell phone or personal digital assistant.

In one embodiment, processor 410 can include one or more physical devices, such as microprocessors, application processors, microcontrollers, programmable logic devices, or other processing means. The processing operations performed by processor 410 include the execution of an operating platform or operating system on which applications and/or device functions are executed. The processing operations include operations related to I/O (input/output) with a human user or with other devices, operations related to power management, and/or operations related to connecting the computing device 400 to another device. The processing operations may also include operations related to audio I/O and/or display I/O.

In one embodiment, computing device 400 includes audio subsystem 420, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 400, or connected to the computing device 400. In one embodiment, a user interacts with the computing device 400 by providing audio commands that are received and processed by processor 410.

Display subsystem 430 represents hardware (e.g., display devices) and software (e.g., drivers) components that provide a visual and/or tactile display for a user to interact with the computing device 400. Display subsystem 430 includes display interface 432 which includes the particular screen or hardware device used to provide a display to a user. In one embodiment, display interface 432 includes logic separate from processor 410 to perform at least some processing related to the display. In one embodiment, display subsystem 430 includes a touch screen (or touch pad) device that provides both output and input to a user.

I/O controller 440 represents hardware devices and software components related to interaction with a user. I/O controller 440 is operable to manage hardware that is part of audio subsystem 420 and/or display subsystem 430. Additionally, I/O controller 440 illustrates a connection point for additional devices that connect to computing device 400 through which a user might interact with the system. For example, devices that can be attached to the computing device 400 might include microphone devices, speaker or stereo systems, video systems or other display devices, keyboard or keypad devices, or other I/O devices for use with specific applications such as card readers or other devices.

As mentioned above, I/O controller 440 can interact with audio subsystem 420 and/or display subsystem 430. For example, input through a microphone or other audio device can provide input or commands for one or more applications or functions of the computing device 400. Additionally, audio output can be provided instead of, or in addition to display output. In another example, if display subsystem 430 includes a touch screen, the display device also acts as an input device, which can be at least partially managed by I/O controller 440. There can also be additional buttons or switches on the computing device 400 to provide I/O functions managed by I/O controller 440.

In one embodiment, I/O controller 440 manages devices such as accelerometers, cameras, light sensors or other environmental sensors, or other hardware that can be included in the computing device 400. The input can be part of direct user interaction, as well as providing environmental input to the system to influence its operations (such as filtering for noise, adjusting displays for brightness detection, applying a flash for a camera, or other features).

In one embodiment, computing device 400 includes power management 450 that manages battery power usage, charging of the battery, and features related to power saving operation. Memory subsystem 460 includes memory devices for storing information in computing device 400. Memory can include nonvolatile (state does not change if power to the memory device is interrupted) and/or volatile (state is indeterminate if power to the memory device is interrupted) memory devices. Memory subsystem 460 can store application data, user data, music, photos, documents, or other data, as well as system data (whether long-term or temporary) related to the execution of the applications and functions of the computing device 400.

Elements of embodiments are also provided as a machine-readable medium (e.g., memory 460) for storing the computer-executable instructions. The machine-readable medium (e.g., memory 460) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity via network interface 470 includes hardware devices (e.g., wireless and/or wired connectors and communication hardware) and software components (e.g., drivers, protocol stacks) to enable the computing device 400 to communicate with external devices. The computing device 400 could be separate devices, such as other computing devices, wireless access points or base stations, as well as peripherals such as headsets, printers, or other devices.

Network interface 470 can include multiple different types of connectivity. To generalize, the computing device 400 is illustrated with cellular connectivity 472 and wireless connectivity 474. Cellular connectivity 472 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 474 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 480 include hardware interfaces and connectors, as well as software components (e.g., drivers, protocol stacks) to make peripheral connections. It will be understood that the computing device 400 could both be a peripheral device ("to" 482) to other computing devices, as well as have peripheral devices ("from" 484) connected to it. The computing device 400 commonly has a "docking" connector to connect to other computing devices for purposes such as managing (e.g., downloading and/or uploading, changing, synchronizing) content on computing device 400. Additionally, a docking connector can allow computing device 400 to connect to certain peripherals that allow the computing device 400 to control content output, for example, to audiovisual or other systems.

In addition to a proprietary docking connector or other proprietary connection hardware, the computing device 400 can make peripheral connections 480 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. A microelectronics package, comprising:
a dielectric and at least a first conductor layer and a second conductor layer within the dielectric; and
an inductor structure having a magnetic core at least partially within the dielectric and extending at least between the first conductor layer and the second conductor layer, wherein the inductor structure comprises a conductor within the first and second conductor layers that extends a length horizontally within the magnetic core, and wherein, over at least a majority of the length, the conductor extends a height vertically within the magnetic core between the first conductor layer and the second conductor layer.

2. The microelectronics package of claim 1, wherein the first conductor layer is adjacent to the second conductor layer, and a trench via portion of the conductor between the first conductor layer and the second conductor layer has a narrower width than a portion within the first conductor layer or the second conductor layer.

3. The microelectronics package of claim 1, wherein the conductor has two sidewalls extending from the first conductor layer and the second conductor layer, and lateral ridges in the first conductor layer and the second conductor layer that overhang the two sidewalls.

4. The microelectronics package of claim 1, wherein the conductor has a z-height that ranges between 50 to 100 microns and wherein the conductor has a width that ranges between 20 and 100 microns, and wherein the conductor has a length that is greater than the width.

5. The microelectronics package of claim 1, wherein the magnetic core comprises a first portion within the dielectric, and a contiguous second portion that extends substantially over the dielectric, and wherein the first portion comprises a first magnetic material and the second portion comprises a second magnetic material.

6. The microelectronics package of claim 5, wherein the first magnetic material and the second magnetic material comprise magnetic particles within a polymer matrix, wherein the magnetic particles comprise any one of a ferrite, an alloy of iron and nickel or cobalt, and wherein the polymer matrix comprises an epoxy resin or an acrylic resin.

7. The microelectronics package of claim 1, wherein the inductor structure comprises a plurality of first conductors interconnected in series by one or more bridging conductors extending laterally between ones of the plurality of first conductors in a serpentine layout extending horizontally at least partially within the magnetic core, and wherein the length of the inductor structure is approximately the sum of the lengths of the first inductors and the one or more bridging conductors.

8. The microelectronics package of claim 1, wherein inductor structure comprises a plurality of first conductors interconnected in parallel, wherein the ones of the first conductors are joined at a first end and extend to a second end, and wherein the second ends are isolated one from the other.

9. A system comprising:
the microelectronics package of claim 1; and
a die coupled to the substrate, wherein the die comprises an integrated circuit coupled to the inductor structure, and wherein the integrated circuit is coupled to a power supply.

10. The system of claim 9, wherein the integrated circuit is a microprocessor comprising at least one integrated voltage regulator circuit, and wherein the at least one integrated voltage regulator circuit is coupled to the inductor structure.

11. The system of claim 9, wherein the inductor structure has an inductance of at least 5 nanohenries when measured at 140 MHz.

12. The system of claim 9, wherein the integrated circuit is any one of a radio frequency amplifier circuit, a radio frequency oscillator circuit, a radio frequency phasing circuit, radio frequency mixing circuit or a direct current voltage regulator circuit.

* * * * *